(12) United States Patent
Davies

(10) Patent No.: US 7,202,732 B2
(45) Date of Patent: Apr. 10, 2007

(54) TRANSIMPEDANCE AMPLIFIER WITH LINEARIZED TRANSCONDUCTANCE FEEDBACK

(75) Inventor: Andrew Douglas Davies, Rochester, MN (US)

(73) Assignee: JDS Uniphase Corporation, Milpitas, CA (US)

( * ) Notice: Subject to any disclaimer, the term of this patent is extended or adjusted under 35 U.S.C. 154(b) by 184 days.

(21) Appl. No.: 11/011,719

(22) Filed: Dec. 14, 2004

(65) Prior Publication Data

US 2005/0128006 A1 Jun. 16, 2005

Related U.S. Application Data

(60) Provisional application No. 60/529,663, filed on Dec. 15, 2003.

(51) Int. Cl.
*H03F 1/34* (2006.01)
*H03F 3/08* (2006.01)

(52) U.S. Cl. .................................... 330/85; 330/308

(58) Field of Classification Search ................ 330/85, 330/110, 308; 250/214 AG
See application file for complete search history.

(56) References Cited

U.S. PATENT DOCUMENTS

| | | | |
|---|---|---|---|
| 6,404,281 B1 | 6/2002 | Kobayashi | 330/85 |
| 6,504,429 B2 | 1/2003 | Kobayashi | 330/85 |
| 6,590,455 B1 | 7/2003 | Kobayashi | 330/308 |
| 6,690,218 B2 | 2/2004 | Goldblatt | 327/175 |
| 6,753,733 B2 | 6/2004 | Bakx | 330/292 |
| 6,771,132 B1 | 8/2004 | Denoyer et al. | 330/308 |
| 2004/0196105 A1* | 10/2004 | Filip | 330/308 |

* cited by examiner

*Primary Examiner*—Steven J. Mottola
(74) *Attorney, Agent, or Firm*—Allen, Dyer, Doppelt, Milbrath & Gilchrist, P.A.

(57) ABSTRACT

The invention relates to a feedback circuit for a transimpedance amplifier, which is typically used for converting an input current from a photodiode into an output voltage. The feedback circuit of the present invention linearizes the transconductance feedback, as the input current signal varies, by providing a constant current source for supplementing the DC feedback current through a bypass transistor, thereby reducing a variation in the low frequency cut off.

15 Claims, 3 Drawing Sheets

TRANSIMPEDANCE AMPLIFIER WITH LINEARIZED TRANSCONDUCTANCE FEEDBACK

CROSS-REFERENCE TO RELATED APPLICATIONS

The present invention claims priority from U.S. Patent Application No. 60/529,663 filed Dec. 15, 2003, which is incorporated herein by reference.

TECHNICAL FIELD

The present invention relates to a feedback circuit for a transimpedance amplifier (TIA), and in particular to a feedback circuit for linearizing the transconductance feedback in a transimpedance amplifier used in combination with a photodiode.

BACKGROUND OF THE INVENTION

A level restoration circuit in a transimpedance amplifier removes the DC component, i.e. the average value which carries no information, of an optical signal exiting an optical fiber onto a photodiode, while at the same time keeping the low frequency −3 dB frequency low enough to meet requirements for both Telecom and Datacom applications.

With reference to FIG. 1, a conventional TIA circuit, generally indicated at 1, converts the current $I_{PD}$ exiting a photodiode 2, into an output voltage $V_{OUT}$. The photodiode current $I_{PD}$, which enters the TIA circuit 1 at an input terminal 3, includes both a DC component and an AC component. The AC component, which carries the information, must be maintained and sent down an amplification chain 4 to final receiving equipment (not shown), while the DC component should be ignored and if possible eliminated. A feedback circuit, generally indicated at 5, removes the DC component by means of negative feedback, implemented by a feedback amplifier 6/low pass filter (i.e. Capacitor 7) and a bypass transistor 8 combination. The feedback amplifier 6/low pass filter 7 has gain, and removes the AC component of a voltage feedback signal $V_{FB}$, leaving only a DC component $V_{FBDC}$. The capacitor 7 is used to set the low-frequency cutoff that the TIA circuit 1 requires. The bypass transistor 8 takes that DC component $V_{FBDC}$ of the voltage feedback signal $V_{FB}$ and generates a DC current $I_{FBDC}$ in the collector 9, which by the action of negative feedback equals the incoming DC current $I_{PDDC}$ from the photodiode 2. Accordingly, the DC component $I_{PDDC}$ is removed from the incoming signal $I_{PD}$ and passed to the ground GRND through the emitter 11 of the bypass transistor 8.

Unfortunately, the low frequency −3 dB cut off frequency, i.e. the low frequency cut off, of the TIA 1 can vary dramatically depending on the input current $I_{PD}$, which makes meeting performance requirements difficult. The low frequency cut off of the entire wideband TIA 1 is proportional to the gain of the feedback circuit 5, as well as the size of the filtering capacitor 7. The gain of the feedback circuit 5 is a transconductance because the feedback circuit 5 samples the differential output voltage, $V_{out}$=Outp−Outm, and produces a current $I_{FBDC}$ at the collector 9 of the bypass transistor 8. The transconductance gain of the bypass transistor 9, according to basic small signal transistor theory is the collector current divided by the thermal voltage ($G_T=I_c/V_t=I_{FBDC}/V_t$), i.e. the gain varies with the DC current $I_{FBDC}$ flowing in the device. Accordingly, since the transconductance gain of the whole feedback circuit 5 is proportional to the transconductance gain of the bypass transistor 8, the low frequency cut off is proportional to the transconductance of the bypass transistor 8. This can cause a large variation in the low frequency cut off, since the photodiode current $I_{PD}$ can vary over a large range of values. For example: the photodiode DC current $I_{PD}$ can vary from about 10 uA, up to about 1 mA, which makes a 40 dB of difference between the low and high values of the transconductance gain of the bypass transistor 8, i.e. 20*log(1 mA/10 uA). Accordingly, the variation in transconductance gain causes the low frequency cut off to also vary significantly, i.e. if the low frequency cut off is set to 50 kHz at a low input current, the low frequency cut off could get as high as 5 MHz at a high input current, which is quite unacceptable in many applications including Ethernet and Sonet Telecom. Moreover, the filter capacitor 7 must be designed to be large enough to maintain the low frequency cut off small, which can result in unreasonably large capacitors affecting the size of the required packaging.

U.S. Pat. No. 6,404,281, issued Jun. 11, 2002 in the name of Kobayashi et al; U.S. Pat. No. 6,504,429, issued Jan. 7, 2003 to Kobayashi et al; and U.S. Pat. No. 6,771,132 issued Aug. 3, 2004 to Denoyer et al disclose improvements to TIA feedback circuits that include minimizing the upper limit of the low frequency cut off frequency; however, none of these references addresses the problem caused by the variation in transconductance gain.

An object of the present invention is to overcome the shortcomings of the prior art by providing a feedback circuit with a relatively small transconductance gain variation resulting in relatively small variation in the low frequency cut off frequency over a range of photodiode input currents.

SUMMARY OF THE INVENTION

Accordingly, the present invention relates to a transimpedance amplifier comprising:

an amplifier circuit for converting a variable input current signal, which has AC and DC components, into an output voltage; and a feedback circuit generating a feedback voltage signal with AC and DC components from the output voltage.

The feedback circuit including:

a feedback amplifier/low pass filter, defining a low frequency cut off, for removing the AC component of the feedback voltage signal;

a bypass transistor, which receives the DC component of the feedback voltage signal and generates a DC feedback current substantially equal to the DC component of the input current signal for removing the DC component of the input current signal, the feedback circuit having a feedback gain; and a linearizing circuit for linearizing the feedback gain as the input current signal varies, including a constant current source for supplementing the DC feedback current through the bypass transistor, thereby reducing a variation in the low frequency cut off caused by the variation in the input current.

BRIEF DESCRIPTION OF THE DRAWINGS

The invention will be described in greater detail with reference to the accompanying drawings which represent preferred embodiments thereof, wherein.

DETAILED DESCRIPTION

Figure 1:
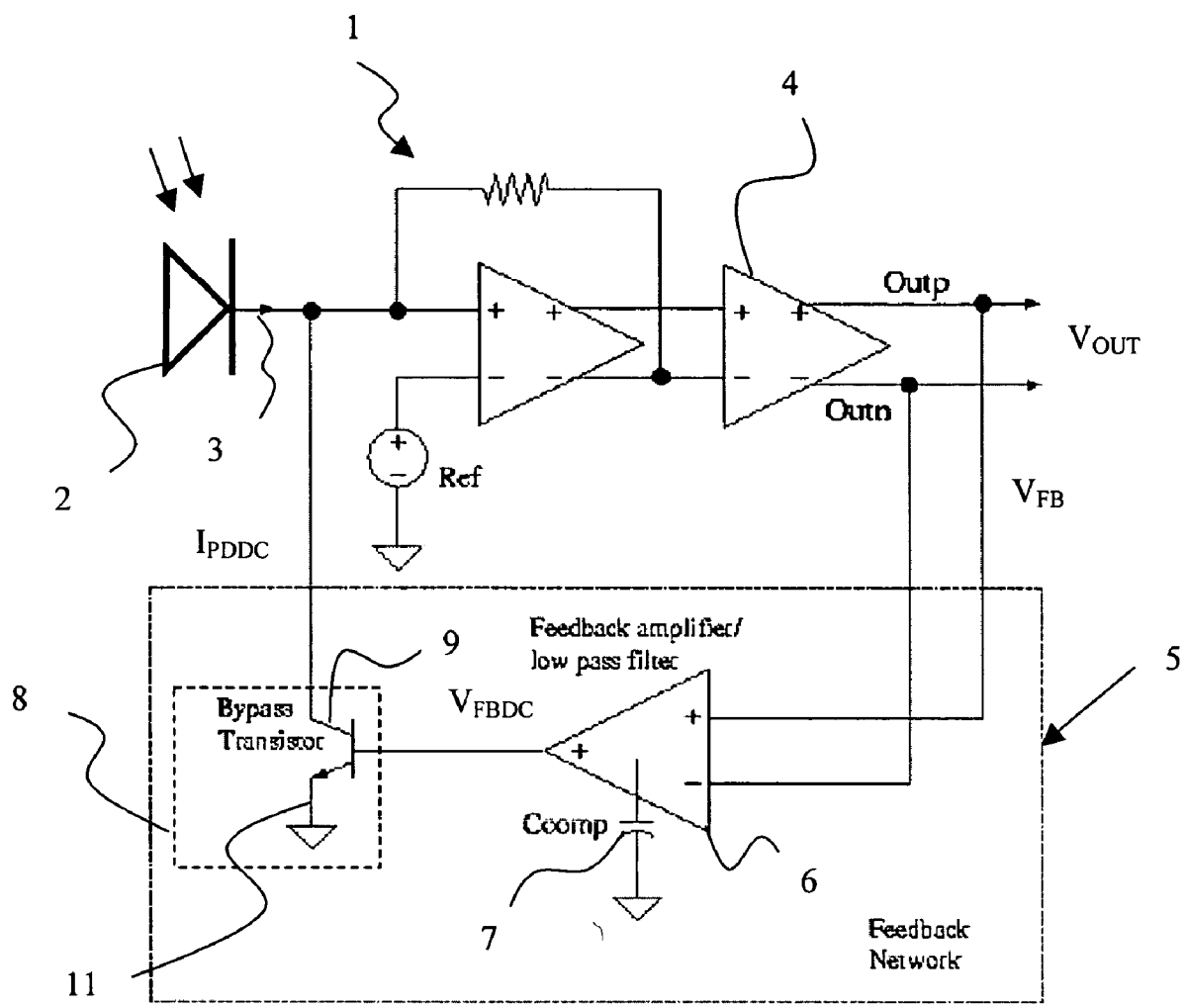
FIG. 1 illustrates a conventional TIA amplifier circuit with feedback circuit.
Figure 2:
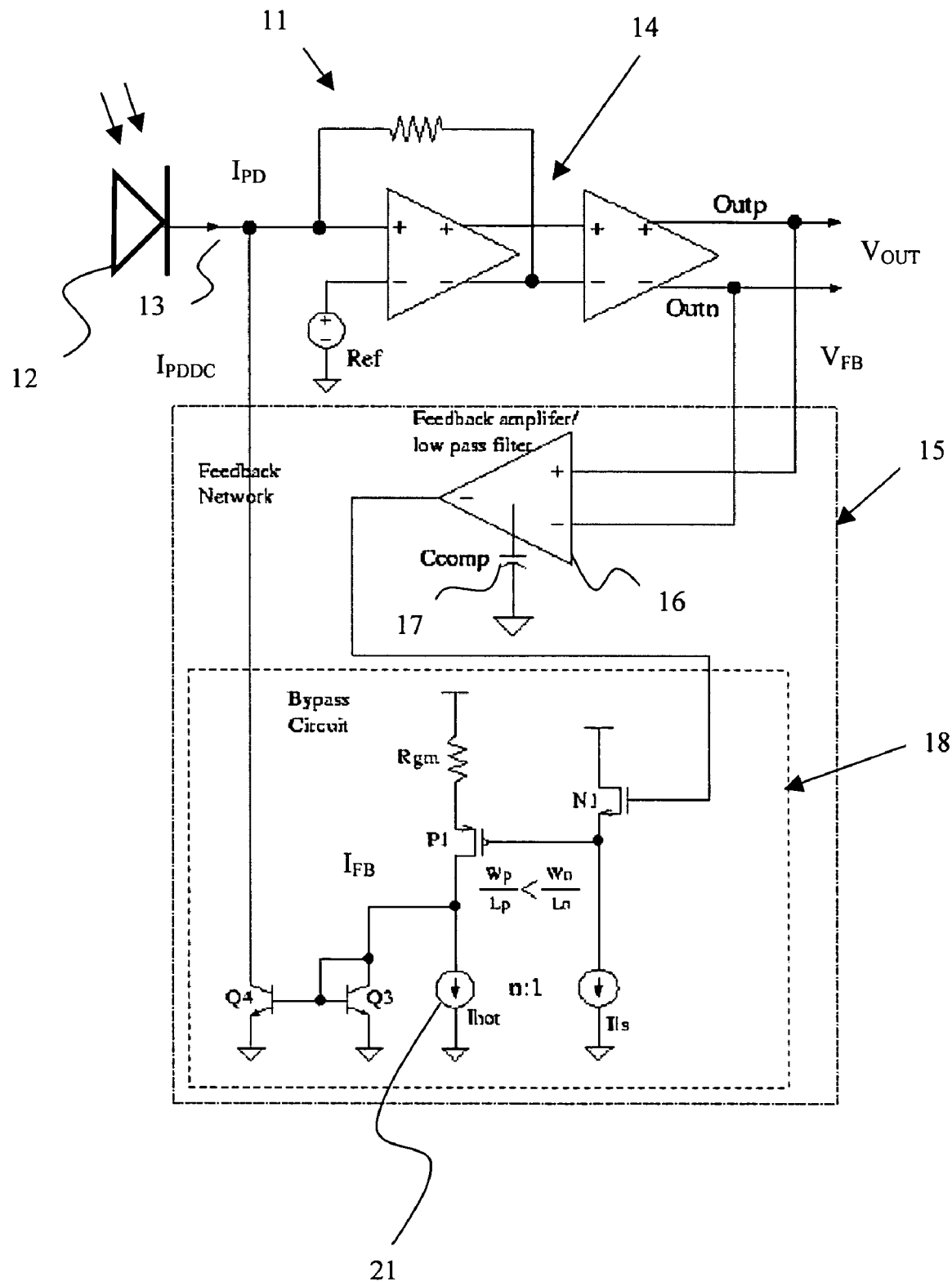
FIG. 2 illustrates a TIA amplifier circuit with feedback circuit according to the present invention.

The present invention solves the aforementioned problem by linearizing the feedback network gain, which removes the variability of the feedback gain, and hence the variability in the low frequency cut off of the TIA circuit. As illustrated in FIG. 2, a TIA circuit 11 receives photodiode current $I_{PD}$ from photodiode 12 via input terminal 13. Amplification chain 14 amplifies and converts the input current $I_{PD}$ producing differential output voltage $V_{OUT}$=Outp−Outn.

Figure 3:
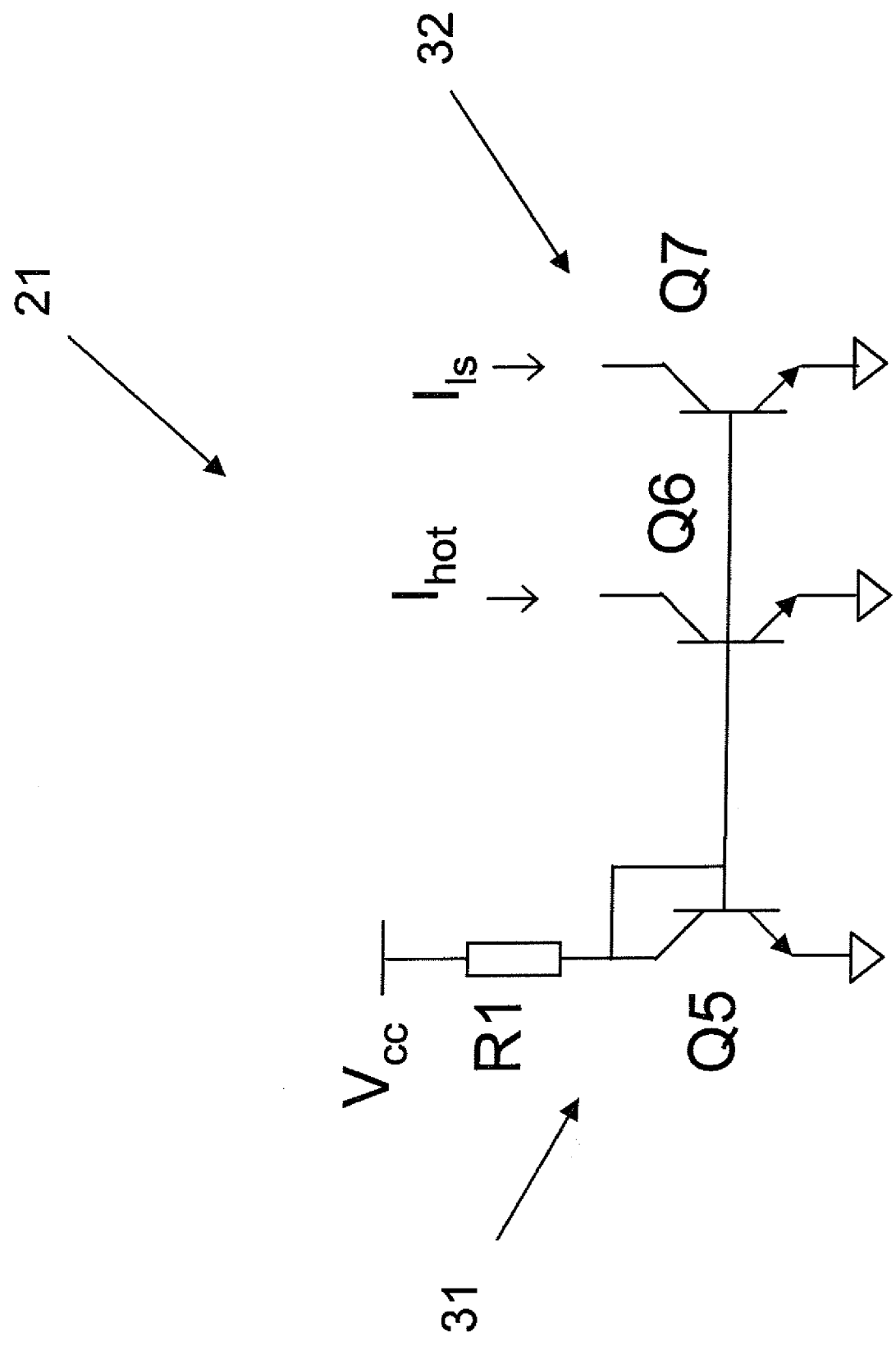
FIG. 3 illustrates a current source transistor 31 and a current mirror pair 32 in accordance with the constant current source of FIG. 2.

The linearization is accomplished by a feedback network 15 including a feedback amplifier 16/low pass capacitor filter 17 combination, and a bypass circuit 18. The bypass circuit 18 includes an NMOS transistor N1, which provides a voltage level shift to the gate of a PFET transistor P1. The PFET transistor P1 and a gain resistor $R_{gm}$ convert that voltage into a current $I_{FB}$, which is mirrored by a first NPN transistor Q3 to a second NPN transistor Q4 for removal of the DC component $I_{PDDC}$ from the incoming photodiode current $I_{PD}$. However, to reduce the variability of the transconductance gain of the PFET transistor P1 as the input current $I_{PD}$ from the photodiode 12 varies, a constant current source 21 supplements the feedback current $I_{FB}$ with a constant current $I_{hot}$, which is always maintained in the PFET transistor P1. $I_{hot}$ causes P1 to be always "on" and to amplify at a more consistent gain level. The constant current source 21 can include a current source transistor 31 and a current mirror pair 32 (See FIG. 3). Alternatively, $I_{hot}$ may be produced by a bandgap current source or by a voltage reference. Ideally, $I_{hot}$ is equal to or greater than the typical high value of the photodiode current, and preferably two to three times greater. The small signal transconductance of the PFET transistor P1 is given by gm(p1)=sqrt(2*K'*W*$I_d$/L), from basic transistor theory, where K' is a process parameter, W and L are the width and length of the PFET, and $I_d$ is the drain current flowing in the PFET.

Using the example cited above, the variation in the drain current $I_d$, assuming a constant current $I_{hot}$ of 2 mA, is from 2.01 mA for the low DC optical input signal (2 mA $I_{hot}$+10 uA $I_{FB}$) to 3 mA for the high DC optical input signal (2 mA $I_{hot}$+1 mA $I_{FB}$). Accordingly, the variation in the return feedback transconductance is only 1.7 dB instead of 40 dB, i.e. 20*log(sqrt(3 mA)/sqrt(2.01 mA)). The reduction in the variability, enables the low frequency cut off frequency to be kept low over all input current ranges, which means that applications for wideband transimpedance amplifiers like Sonet and Ethernet are more easily met with the same TIA. Furthermore, the value of the capacitor 17 can be much lower than previously, because the gain variation of 100:1 has been eliminated. In the prior art, the capacitor 7 would be required to be 100× larger than with the present invention, i.e. the size of the capacitor 17 can be kept so small that it could be integrated on a chip, eliminating the need for a separate external capacitor.

Since the DC input current can be very low, the excess current (above $I_{hot}$) through Rgm must also go very low. This is accomplished easily over process, temperature, and supply voltage variations by making P1 smaller than N1, e.g. $W_p/L_p < W_n/L_n$, as well as by making the current through the P1 larger than that in N1 by a factor of n as implemented by the current mirror pair $I_{hot}$ and $I_{ls}$. This allows the current through Rgm to be brought as low as the input signal requires.

Note also, for extra flexibility, the relative sizes of Q3 and Q4 can be mismatched to produce a current mirror that is not necessarily 1:1; however, Q3 and Q4 should be matched, if possible. The current multiplication can also be accomplished by taking linear combinations of Q3 and Q4 transistors to produce the desired output current. Multiplication Factor=(# of Q4 transistors)/(# of Q3 transistors) assuming equal geometries in Q4 and Q3. The specific transistors can be other equivalent devices, e.g. the PFET transistor P1 could be a PNP transistor, the NPNs Q3 and Q4 could be NFET transistors, and N1 could be an NPN emitter follower.

I claim:

1. A transimpedance amplifier comprising:
   an amplifier circuit for converting a variable input current signal, which has AC and DC components, into an output voltage; and
   a feedback circuit generating a feedback voltage signal with AC and DC components from the output voltage, the feedback circuit including:
      a feedback amplifier/low pass filter, defining a low frequency cut off, for removing the AC component of the feedback voltage signal;
      a bypass transistor, which receives the DC component of the feedback voltage signal and generates a DC feedback current substantially equal to the DC component of the input current signal for removing the DC component of the input current signal, the feedback circuit having a feedback gain; and
      a linearizing circuit for linearizing the feedback gain as the input current signal varies, including a constant current source for supplementing the DC feedback current through the bypass transistor, thereby reducing a variation in the low frequency cut off caused by the variation in the input current;
   wherein the input current signal ranges from a low to a high current; and
   wherein the constant current source generates a constant current equal to or greater than the high current.

2. The transimpedance amplifier according to claim 1, wherein the constant current source generates a constant current 2 to 3 times greater than the high current.

3. The transimpedance amplifier according to claim 1, wherein the linearizing circuit further comprises a gain resistance for converting the DC component of the feedback voltage into the DC feedback current.

4. A transimpedance amplifier comprising:
   an amplifier circuit for converting a variable input current signal, which has AC and DC components, into an output voltage; and
   a feedback circuit generating a feedback voltage signal with AC and DC components from the output voltage, the feedback circuit including:
      a feedback amplifier/low pass filter, defining a low frequency cut off, for removing the AC component of the feedback voltage signal;
      a bypass transistor, which receives the DC component of the feedback voltage signal and generates a DC feedback current substantially equal to the DC component of the input current signal for removing the DC component of the input current signal, the feedback circuit having a feedback gain;
      a linearizing circuit for linearizing the feedback gain as the input current signal varies, including a constant current source for supplementing the DC feedback current through the bypass transistor, thereby reducing a variation in the low frequency cut off caused by the variation in the input current; and a current mirror for mirroring the DC component of the feedback current, which removes the DC component of the input current signal.

5. The transimpedance amplifier according to claim 4, wherein the input current signal ranges from a low to a high current; and wherein the constant current source generates a constant current equal to or greater than the high current.

6. A transimpedance amplifier comprising:
an amplifier circuit for converting a variable input current signal, which has AC and DC components, into an output voltage; and
a feedback circuit generating a feedback voltage signal with AC and DC components from the output voltage, the feedback circuit including:
a feedback amplifier/low pass filter, defining a low frequency cut off, for removing the AC component of the feedback voltage signal;
a bypass transistor, which receives the DC component of the feedback voltage signal and generates a DC feedback current substantially equal to the DC component of the input current signal for removing the DC component of the input current signal, the feedback circuit having a feedback gain; and
a linearizing circuit for linearizing the feedback gain as the input current signal varies, including a constant current source for supplementing the DC feedback current through the bypass transistor, thereby reducing a variation in the low frequency cut off caused by the variation in the input current;
wherein the constant current source includes a current source transistor and a current mirror pair.

7. The transimpedance amplifier according to claim 6, wherein the input current signal ranges from a low to a high current; and wherein the constant current source generates a constant current equal to or greater than the high current.

8. The transimpedance amplifier according to claim 7, wherein the constant current source generates a constant current 2 to 3 times greater than the high current.

9. The transimpedance amplifier according to claim 6, wherein the linearizing circuit further comprises a gain resistance for converting the DC component of the feedback voltage into the DC feedback current.

10. The transimpedance amplifier according to claim 6, further comprising a current mirror for mirroring the DC component of the feedback current, which removes the DC component of the input current signal.

11. The transimpedance amplifier according to claim 5, wherein the constant current source generates a constant current 2 to 3 times greater than the high current.

12. The transimpedance amplifier according to claim 4, wherein the linearizing circuit further comprises a gain resistance for converting the DC component of the feedback voltage into the DC feedback current.

13. The transimpedance amplifier according to claim 4, wherein the constant current source includes a current source transistor and a current mirror pair.

14. The transimpedance amplifier according to claim 1, further comprising a current mirror for mirroring the DC component of the feedback current, which removes the DC component of the input current signal.

15. The transimpedance amplifier according to claim 1, wherein the constant current source includes a current source transistor and a current mirror pair.

* * * * *